United States Patent
Cloutier et al.

(10) Patent No.: US 10,948,843 B2
(45) Date of Patent: Mar. 16, 2021

(54) METHOD OF MONITORING PARTIAL DISCHARGES IN A HIGH VOLTAGE ELECTRIC MACHINE, AND CONNECTION CABLE THEREFORE

(71) Applicant: VIBROSYSTM INC., Longueuil (CA)

(72) Inventors: Marius Cloutier, Longueuil (CA); Mathieu Cloutier, Richelieu (CA)

(73) Assignee: VIBROSYSTM INC., Longueuil (CA)

( * ) Notice: Subject to any disclaimer, the term of this patent is extended or adjusted under 35 U.S.C. 154(b) by 193 days.

(21) Appl. No.: 16/004,574

(22) Filed: Jun. 11, 2018

(65) Prior Publication Data

US 2018/0356457 A1    Dec. 13, 2018

Related U.S. Application Data

(60) Provisional application No. 62/518,257, filed on Jun. 12, 2017.

(51) Int. Cl.
| | |
|---|---|
| *G03G 15/02* | (2006.01) |
| *H02K 3/40* | (2006.01) |
| *G01R 31/34* | (2020.01) |
| *H02K 11/27* | (2016.01) |
| *G01R 31/12* | (2020.01) |
| *B23K 35/40* | (2006.01) |

(52) U.S. Cl.
CPC ....... *G03G 15/0266* (2013.01); *G01R 31/346* (2013.01); *G03G 15/0291* (2013.01); *H02K 3/40* (2013.01); *H02K 11/27* (2016.01); *B23K 35/406* (2013.01); *G01R 31/1272* (2013.01)

(58) Field of Classification Search
CPC ............ G01R 31/1272; G01R 31/1254; G01R 31/12; H02H 1/0015; H01H 33/26
See application file for complete search history.

(56) References Cited

U.S. PATENT DOCUMENTS

| | | |
|---|---|---|
| 4,158,169 A | 6/1979 | Harrold et al. |
| 4,385,271 A | 5/1983 | Kurtz et al. |
| 4,446,420 A | 5/1984 | Drouet |
| 4,779,051 A | 10/1988 | Griinewald et al. |
| 4,897,607 A | 1/1990 | Griinewald et al. |

(Continued)

OTHER PUBLICATIONS

Elliot Electric Supply, Bussmann Series Full Line Catalog, Jul. 2015, EEI-NEMA Type K and T-Type H and N, EES Spec Sheet, http://www.elliottelectric.com/P/Item/CPS/FL3K8/Similar (Year: 2015).*

(Continued)

*Primary Examiner* — Alesa Allgood
(74) *Attorney, Agent, or Firm* — Norton Rose Fulbright Canada LLP; Alexandre Daoust

(57) ABSTRACT

Partial discharges in a high voltage electric machine can be monitored by a partial discharge monitor connected to the high voltage electric machine successively via a capacitive coupler and a connection cable. The connection cable can have a conductive element designed to self-destruct in the presence of electric current amplitude significantly exceeding expected current amplitudes from said partial discharges, and having diameter designed to avoid creation of additional partial discharges within the cable itself. The connection cable can be light enough to avoid adding excessive weight to the stator windings.

14 Claims, 3 Drawing Sheets

(56) References Cited

U.S. PATENT DOCUMENTS

| | | |
|---|---|---|
| 4,929,903 A | 5/1990 | Saigo et al. |
| 4,967,158 A | 10/1990 | Gonzalez |
| 5,146,170 A | 9/1992 | Ishikawa et al. |
| 5,200,737 A | 4/1993 | Konishi et al. |
| 5,386,193 A | 1/1995 | Maeda et al. |
| 5,396,180 A | 3/1995 | Hampton et al. |
| 5,475,312 A | 12/1995 | Sedding et al. |
| 5,506,511 A | 4/1996 | Nilsson et al. |
| 5,530,364 A | 6/1996 | Mashikian et al. |
| 5,530,366 A | 6/1996 | Nasrallah |
| 5,642,038 A | 6/1997 | Kim et al. |
| 5,767,684 A | 6/1998 | Steennis |
| 5,804,972 A | 9/1998 | de Kock et al. |
| 5,854,556 A | 12/1998 | Steennis et al. |
| 5,982,181 A | 11/1999 | Rokunohe et al. |
| 6,078,180 A | 6/2000 | Jenkinson |
| 6,172,862 B1 | 1/2001 | Jonnatti et al. |
| 6,192,317 B1 | 2/2001 | Yazici et al. |
| 6,255,808 B1 | 7/2001 | Hicker |
| 6,285,538 B1 | 9/2001 | Krahn |
| 6,297,642 B1 | 10/2001 | Shibahara et al. |
| 6,297,645 B1 | 10/2001 | Eriksson et al. |
| 6,300,768 B1 | 10/2001 | Kato et al. |
| 6,313,640 B1 | 11/2001 | Nasrallah et al. |
| 6,333,715 B1 | 12/2001 | Kato et al. |
| 6,340,890 B1 | 1/2002 | Bengtsson et al. |
| 6,420,879 B2 | 7/2002 | Cooke |
| 6,424,162 B1 | 7/2002 | Rokunohe et al. |
| 6,433,557 B1 | 8/2002 | Rashkes et al. |
| 6,445,189 B1 | 9/2002 | Pakonen et al. |
| 6,448,782 B1 | 9/2002 | Pakonen et al. |
| 6,483,316 B2 | 11/2002 | Kato et al. |
| 6,489,782 B1 | 12/2002 | Baier et al. |
| 6,504,382 B2 | 1/2003 | Smith et al. |
| 6,507,181 B1 | 1/2003 | Pakonen et al. |
| 6,518,772 B1 | 2/2003 | Milkovic et al. |
| 6,774,639 B1 | 8/2004 | Unsworth |
| 6,930,491 B2 | 8/2005 | Gregory et al. |
| 6,930,610 B2 | 8/2005 | Gao et al. |
| 6,937,027 B2 | 8/2005 | Koo et al. |
| 7,030,621 B2 | 4/2006 | Sarkozi et al. |
| 7,071,701 B2 | 7/2006 | Roman et al. |
| 7,081,757 B2 | 7/2006 | Unsworth et al. |
| 7,112,968 B1 | 9/2006 | Nishizawa |
| 7,145,345 B2 | 12/2006 | Sarkozi et al. |
| 7,154,279 B2 | 12/2006 | Gregory et al. |
| 7,161,873 B2 | 1/2007 | Kuppuswamy et al. |
| 7,180,303 B1 | 2/2007 | Chen et al. |
| 7,183,776 B1 | 2/2007 | Hicks et al. |
| 7,202,672 B2 | 4/2007 | Hicks et al. |
| 7,256,584 B2 | 8/2007 | Moriyama et al. |
| 7,282,923 B2 | 10/2007 | Goodrich et al. |
| 7,285,960 B2 | 10/2007 | Koch et al. |
| 7,285,961 B2 | 10/2007 | Shinmoto et al. |
| 7,388,384 B2 | 6/2008 | Kato et al. |
| 7,579,843 B2 | 8/2009 | Younsi et al. |
| 7,746,082 B2 | 6/2010 | Maruyama et al. |
| 7,782,063 B2 | 8/2010 | Ohtsuka et al. |
| 8,008,925 B2 | 8/2011 | Twerdochlib |
| 8,008,926 B2 | 8/2011 | Park et al. |
| 8,010,239 B2 | 8/2011 | Jeong |
| 8,098,072 B2 | 1/2012 | TWerdochlib |
| 8,143,899 B2 | 3/2012 | Younsi et al. |
| 8,179,146 B2 | 5/2012 | Nam et al. |
| 8,193,818 B2 | 6/2012 | Horowy et al. |
| 8,199,343 B2 | 6/2012 | Wayman et al. |
| 8,234,085 B2 | 7/2012 | Montanari et al. |
| 8,242,786 B2 | 8/2012 | Fuhrmann et al. |
| 8,294,471 B2 | 10/2012 | Park et al. |
| 8,467,982 B2 | 6/2013 | Serra et al. |
| 8,525,523 B2 | 9/2013 | Kerl et al. |
| 8,527,221 B2 | 9/2013 | Montanari et al. |
| 8,575,943 B2 | 11/2013 | Emanuel et al. |
| 8,760,171 B2 | 6/2014 | Steineke et al. |
| 8,797,045 B2 | 8/2014 | Elze et al. |
| 8,816,694 B2 | 8/2014 | Obata et al. |
| 8,816,700 B2 | 8/2014 | Di Stefano et al. |
| 8,843,349 B2 | 9/2014 | Kang et al. |
| 8,981,761 B2 | 3/2015 | Maruyama et al. |
| 2001/0048305 A1* | 12/2001 | Borsi .................. G01R 33/385 324/322 |
| 2008/0088314 A1 | 4/2008 | Younsi et al. |
| 2009/0189594 A1 | 7/2009 | Cern |
| 2010/0013494 A1 | 1/2010 | Twerdochib |
| 2010/0073008 A1 | 3/2010 | Twerdochib |
| 2011/0030994 A1* | 2/2011 | Widmer ................. H01B 17/54 174/188 |
| 2017/0317484 A1* | 11/2017 | Nakada .................... H01G 4/40 |

OTHER PUBLICATIONS

Braidless Silicone 150, p. 5, Nov. 2012 https://www.mayerelectric.com/ASSETS/DOCUMENTS/CMS/EN/RAXNPA16T007GRAY.pdf (Year: 2012).*

Wiki Open Electrical, Partial Discharge, retrieved from Internet, Aug. 11, 2015.

IEEE Xplore, In-Service Partial Discharge Testing of Generator Insulation, M. Kurtz and G. C. Stone, Ontario Hydro, Research Division, Toronto, Canada, IEEE Trans. Electr. Insul, vol. EI-14 N°2, Apr. 1979.

* cited by examiner

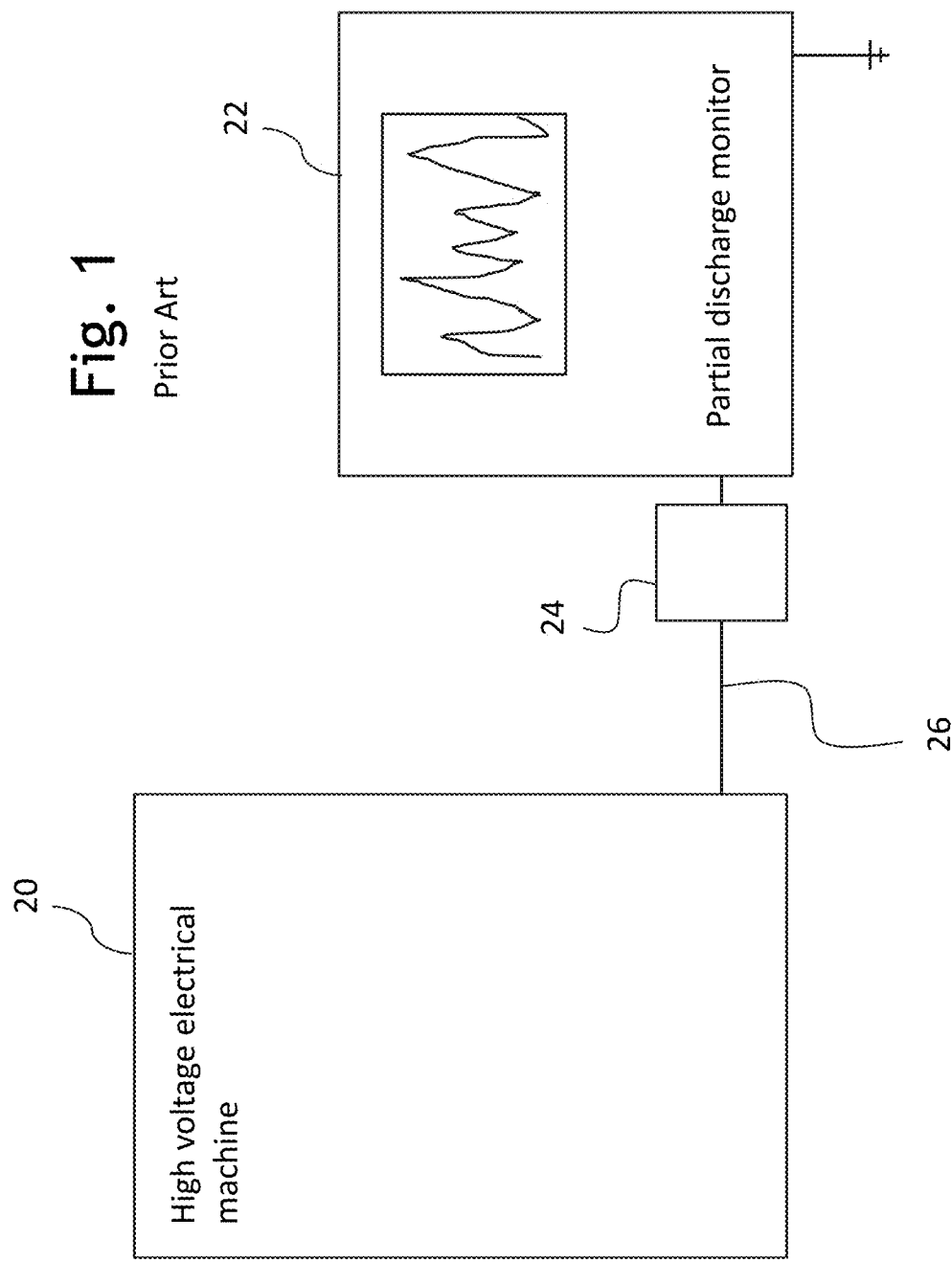

METHOD OF MONITORING PARTIAL DISCHARGES IN A HIGH VOLTAGE ELECTRIC MACHINE, AND CONNECTION CABLE THEREFORE

FIELD

The improvements generally relate to the field of connection cables used between the electric output leads of high-voltage electric apparatus and low power sensing devices, and more particularly between electric machines and the capacitive couplers used to monitor partial discharges occurring in the windings of those machines.

BACKGROUND

FIG. 1 represents a common scenario in which a high-voltage electric machine 20 (e.g. generator, motor, transformer or the like) is monitored by an electronic device which will be referred to herein as a partial discharge monitor 22 (also referred to as a partial discharge analyser). Such devices are well known in the art and can be obtained from certain manufacturers.

More specifically, the monitor 22 is intended to allow analysis of the quality and state of wear of the insulation of windings of the high-voltage electric machine 20 through the observation of partial discharges. Partial discharges can consist of small electrical discharges occurring within defects, such as air pockets, of the insulation. These small electrical discharges manifest themselves as high frequency current pulses.

A capacitive coupler 24 plays the role of a low frequency signal filter, i.e. essentially a selected capacitance circuitry that most preferably lets through high frequency signals at normally very small electrical currents. The capacitive coupler 24 can be connected on one end, via cables 26, to high-voltage leads of a stator or transformer windings (i.e. to the high-voltage electric machine 20), and on the other end to a ground through the partial discharge monitor, the latter typically being provided in the form of a secured low voltage device.

For partial discharges analysis, a reference signal, typically at 50 or 60 Hz frequency is required. The current intensity is in the order of 1 milli-Ampere and for high frequency signals, current intensity is in order of 1 pico-Ampere. The 50 Hz or 60 Hz voltage can be in the order of 15 kV to 24 kV at the measuring point.

In commonly available high-voltage capacitive couplers 24, connections with the high-voltage electric machine leads consist of cylindrical cables 26 that are available on the market, such as a "HV 200c/15 kV/AWG #2" 3 feet cable, which have a conductor diameter (6.54 mm in the case of AWG 2) designed to be sufficient to allow high current circulation and a very low electrical resistance and to avoid generating significant additional partial discharges of their own. An example of a connecting cable 26 is shown in FIG. 2. The connecting cable 26, has a conductor consisting of several conducting strands 1, surrounded by a filler 2 and by a jacket insulation 3. As mentioned earlier the large diameter conductor has a power transfer capacity being much greater than the power required during normal operation of the partial discharge monitor and could thus lead to undesirably high power conduction should the circuit be shorted. They are used for partial discharge measurement because of their availability on the market even though they are meant for totally different applications. This problem has been alleviated to a certain degree by some capacitive coupler manufacturers via the provision of a special fuse located before the capacitance. Nonetheless, there still remained room for improvement. Moreover, the cable has a significant weight which can create problems in adding a unwanted weight to the stator end windings.

SUMMARY

In accordance with one aspect, there is provided a cable having a conductor with limited amperage capacity and can thus serve as a fuse and self-destroy should unusually high currents be reached. In some embodiments, the cable can be designed to avoid noise generation (cable-imparted partial discharge) by maintaining a sufficient conductor diameter (e.g. above 4 mm, preferably at least 6 mm). Moreover, in some embodiments, the cable can have limited weight and thus avoid adding weight to the stator endwinding.

It was found that reducing the diameter of the cable could cause the cable to generate additional, self-imparted partial discharges, which is undesired. One way to calculate the minimal diameter for a given application is to use the electrostatic formula for a cylindrical charged conductor nearby a grounded plane surface keeping in mind the ionisation level of 3 kV/cm and, as far as the jacket isolation is concerned, the permittivity must be considered to keep the wanted level of isolation. In one embodiment, the cable is a replacement of the "HV 200c/15 kV/AWG #2 3 feet cable" which was used which has a conductor diameter of 6.54 mm. Even if 6.54 mm diameter conductors have been used satisfactorily in the past, it may be preferred to set a greater diameter as the minimum diamenter, for instance (e.g. 7 mm or 8 mm for instance). Because of the limitations with the heavy weight of the metallic cable, the specified isolation in the "HV 200c/15 kV/AWG #2 3 feet cable" is 15 kV. A greater insulation can be preferred in some embodiments. Moreover, lower weight, or linear density, would be compared. Achieving lower weight, or linear density, than the weight or linear density of the "HV 200c/15 kV/AWG #2" 3 feet cable can be preferred in some embodiments. In a cable, the heaviest component can be the conductor. Accordingly, reducing the weight of the conductor can significantly affect the weight of the cable. In one embodiment, the section (surface area) of the cable is reduced below the value of 33.6 mm2 which is typical for AWG 2, while maintaining a comparable, or perhaps even greater diameter, by using a metallic conductor having a relatively thin cylindrical, tubular shape which also limits the amount of electrical current intensity which can pass before the conductor self-destructs. Some semi-conductor materials have lower density than copper, and may be used while also providing lower, or comparable weight. Moreover, it can be preferred to provide the cable with a jacket insulation having above 15 kV, preferably above 20 kV, even preferably above 30 kV. In one embodiment, the cable can have a thin cylindrical conductor of tubular shape limiting the allowed current intensity to a critical value which can be in the order of magnitude of the Ampere, for instance, with a diameter in the range of 6-9 mm, a jacket insulation above 20 kV, and a low-weight filler within the tubular shape, for instance.

One way of achieving sufficient conductor diameter while providing limited amperage capacity is to provide the conductor in a tubular form, of a conductive material, filled by a cylindrical non-conductive support material. The thickness of the wall of the tube is then directly related to the maximum current capacity of the cable. Another way of achieving sufficient conductor diameter is to provide the conductor having a full diameter, but using a semi-conductor material instead of a conductive material. Indeed, the diameter of the conductive tube or of the semi-conductive core can be selected in a manner to avoid generating corona effects or additional partial discharges of their own. Accordingly, the risk of high power short-circuiting across the cable can be mitigated or avoided altogether while further avoiding the inconvenience of cable-imparted partial discharge.

In accordance with one aspect, there is provided a method of monitoring partial discharges in a high voltage electric machine, the method comprising: connecting a partial discharge monitor to the high voltage electric machine successively via a capacitive coupler and a connection cable, said connection cable having a conductive element designed to self-destruct in the presence of a current significantly exceeding expected current amplitudes from said partial discharges, and having a diameter sufficient to impede partial discharges within the cable itself; and monitoring said partial discharges via said connection cable.

In accordance with another aspect, there is provided a connection cable having a conductor element surrounded by a jacket, the conductor element having a cross-section area designed to self-destruct in the presence of a critical current amplitude, the critical current amplitude significantly exceeding expected current amplitudes from partial discharges of a high voltage electric machine, and a diameter sufficient to avoid significant partial discharges within the cable itself.

The cable as described hereinabove can be used to connect electric output leads of any suitable low power sensing device to a high-voltage electric machine.

In accordance with another aspect, there is provided a cable replacing at the same time the cable connecting a high-voltage electrical machine to a partial discharge capacitive coupler and the protecting fuse of the partial discharge capacitive coupler, and within which the conducting (or semi-conducting) element has a selected and pre-determined limited amperage capacity. Preferably, the diameter of the conducting element is selected in a manner to be large enough to avoid representing a source of noise due to partial discharge self-creation.

The conducting (or semi-conducting) element can be in the form of a hollow cylindrical flexible tube of a conductive material enveloping a non-conducting central also flexible cylinder, and being surrounded by a cylindrical insulation jacket. Alternately, the conducting element can be in the form of a full cylindrical flexible body of a semi-conductive material surrounded by a cylindrical insulation jacket, for instance.

Many further features and combinations thereof concerning the present improvements will appear to those skilled in the art following a reading of the instant disclosure.

DESCRIPTION OF THE FIGURES

In the figures,

FIG. 1 is a schematic view of a partial discharge monitor connected to monitor partial discharges of a high voltage electrical machine;

DETAILED DESCRIPTION

In many commonly used high voltage partial discharge couplers, the capacitance of the capacitor is 80 picofarads, the impedance is around 33 mega-ohms at 60 Hz and 40 mega-ohms at 50 Hz. The current then allowed by it is a maximum of 0.5 milli-Ampere. As frequencies increase, impedance decreases to 100 ohms at 20 MHz and 10 ohms at 200 MHz. At those very high frequencies that are of interest for partial discharge monitoring, impedance is low but the power of those high frequency signals is so weak that it is negligible compared to the main power of the machine.

Nonetheless, using a relatively large diameter of the conductor can minimize creation of additional partial discharges from the connecting cable, which could represent undesired noise to the monitor.

Partial discharge monitoring applications typically operate at voltages in the range of 15 kV to 24 kV. In such applications, the minimum diameter of the conductive or semi-conductive part should be at least comparable to the diameter of cable "HV 200c/15 kV/AWG #2 3 feet cable" (i.e. greater or equal to about 6.5 mm diameter) to avoid undesired partial discharge creation by the cable itself. In one embodiment, an improved cable can have lighter material (hollow design with smaller cross-sectional area of conductor or lighter-weight semi-conductor material), a 10 to 30% bigger diameter of the core (i.e. ~7-8.5 mm), and add 20% to the jacket thickness.

In the case of partial discharge analysis of an electric machine operating at voltage higher than 25 kV; the minimal diameter of the conductive or semi-conductive part can be obtained using the electrostatic formula for a cylindrical charged conductor nearby a grounded plane surface keeping in mind the ionisation level of 3 kV/cm. As earlier mentioned, the lighter material for the new invention allows meeting for higher voltage specifications.

Figure 3:
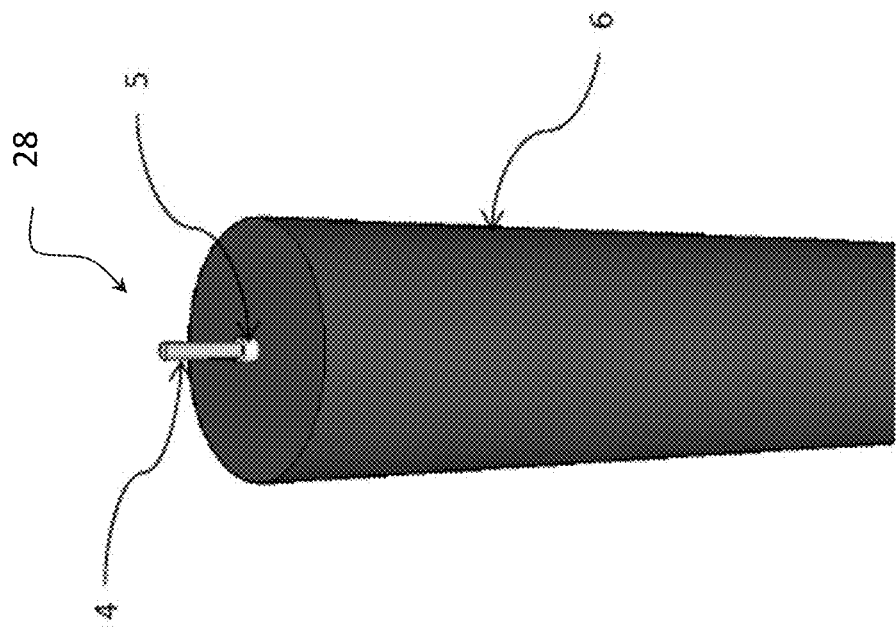
FIG. 3 is an oblique, sectioned view of a first embodiment of a connecting cable.

Referring to FIG. 3, the first example of a connecting cable 28 is presented. Connecting cable 28 is a cable with a conductor 4 having a very small diameter that tolerates a given current amplitude threshold, surrounded by a filler 5 and a large jacket insulation 6. The advantage of such configuration is that the conductor 4 can act as a fuse itself and self-destruct should the current amplitude threshold be exceeded. In the case of partial discharge monitoring, the given current amplitude threshold can be set below 1 Ampere, such as at 100 milli-Amperes for instance. Accordingly, no current having an intensity of several thousands of Amperes can be conveyed through the cable, thereby achieving the goal of protecting the partial discharge monitor from such large amplitude currents. However, the main drawback of this configuration is that the small diameter of conductor 4 may lead to partial discharge creation by the cable itself, a source of noise which could complicate or even prevent satisfactory partial discharge analysis.

Figure 2:
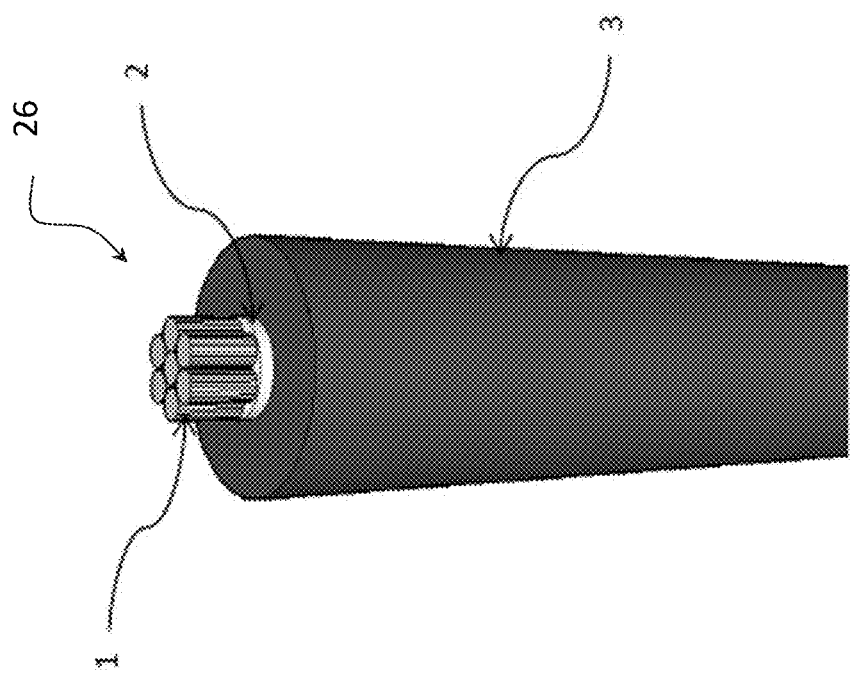
FIG. 2 is an oblique, sectioned view of a connecting cable in accordance with the prior art.
Figure 4:
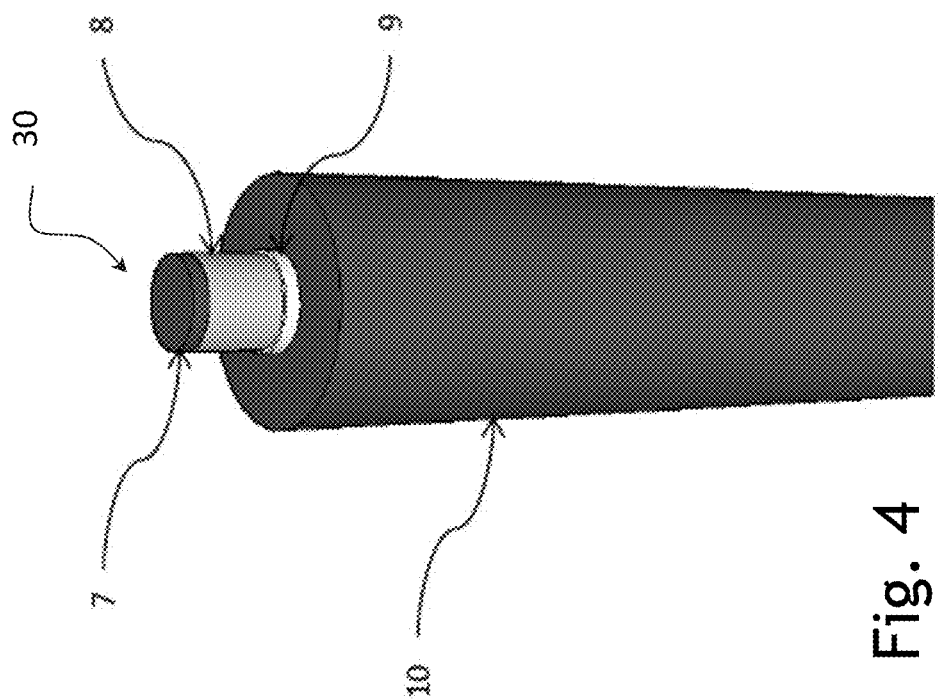
FIG. 4 is an oblique, sectioned view of a second embodiment of a connecting cable.

Referring now to FIG. 4, a second example connecting cable 30 is presented. The proposed connecting cable 30 has an insulated core 7 surrounded by a tubular, thin-walled conducting envelope 8, itself surrounded by filler 9 and an insulated jacket 10. Conducting envelope 8 is designed to allow no more than the given electrical intensity threshold. It was found that this configuration could further eliminates the drawback of additional partial discharge creation, since the conductor diameter can technically be made the same or perhaps even larger than in the prior art cable configuration shown in FIG. 2.

Figure 5:
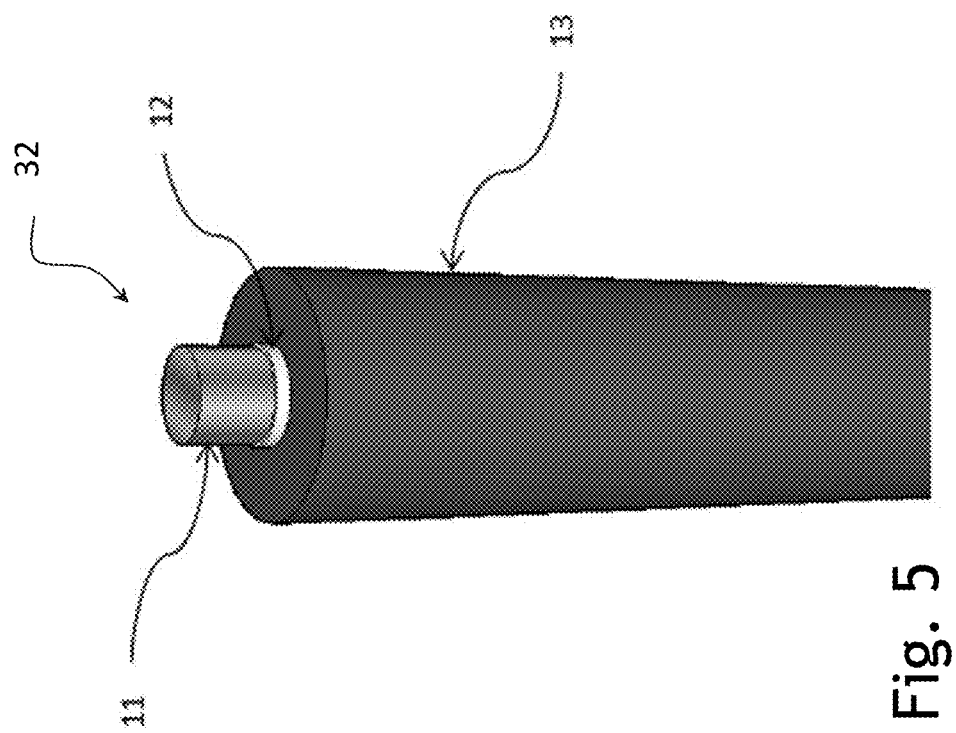
FIG. 5 is an oblique, sectioned view of a third embodiment of a connecting cable.

Referring now to FIG. 5 a third example connecting cable 32 is presented. The proposed connecting cable consists of a semi-conductor 11, surrounded by filler 12 and jacket insulation 13. The diameter of the semi-conductor 11 is the same as or larger than in the FIG. 2 configuration. The composition of semi-conductor 11 is designed to self-destruct if the given electrical intensity threshold is exceeded.

Preferably, the connecting cables of FIG. 4 or FIG. 5 are designed to add not more than tens of Ohms of impedance to the whole partial discharge measuring circuit by the proposed configurations, and the additional impedance will thus be negligible, especially in the context of partial discharge analysis based on trend analysis. Moreover, preferably, the measuring circuitry is not changed.

As can be understood, the examples described above and illustrated are intended to be exemplary only. The scope is indicated by the appended claims.

What is claimed is:

1. A connection cable for monitoring partial discharges in a high voltage electric machine, the connection cable having a semi-conductor element surrounded by a jacket, the jacket providing an insulation of above 15 kV, the semi-conductor element configured to limit a current capacity and having a cross-section area designed to self-destruct in the presence of a critical current amplitude, the critical current amplitude being below the thousands of amperes range, above 100 milli-Amperes, and significantly exceeding expected current amplitudes from the partial discharges of the high voltage electric machine, the semi-conductor element having a diameter of at least 6 mm and sufficient to avoid significant partial discharges within the cable itself.

2. The connection cable of claim 1 wherein the critical current amplitude is above 1 Ampere.

3. The connection cable of claim 1 wherein the diameter of the semi-conductor element if of at least 7 mm.

4. The connection cable of claim 1 wherein the diameter of the semi-conductor element is of at least 8 mm.

5. The connection cable of claim 1 wherein the linear weight is of below the linear weight of a HV 200 c/15 kV/AWG 2 cable.

6. The connection cable of claim 1 wherein the jacket provides an insulation of above 20 kV.

7. The connection cable of claim 1 wherein the critical current amplitude is in the order of magnitude of an ampere.

8. The connection cable of claim 1 wherein the critical current amplitude is below 1 ampere.

9. The connection cable of claim 1 wherein the diameter is no more than 9 mm.

10. The connection cable of claim 1 wherein the diameter of the semi-conductor element further avoids generating corona effects.

11. The connection cable of claim 1 wherein the semi-conductor element is surrounded by a filler.

12. The connection cable of claim 1 wherein the semi-conductor element is provided in the form of a tubular member and is filled by a cylindrical support member made of a non-conductive material.

13. The connection cable of claim 1 wherein the semi-conductor element is provided in the form of a cylindrical member made of semi-conductive material.

14. The connection cable of claim 1 having no more than tens of Ohms of impedance.

* * * * *